(12) United States Patent
Niedernostheide et al.

(10) Patent No.: US 7,521,730 B1
(45) Date of Patent: Apr. 21, 2009

(54) THYRISTOR ARRANGEMENT WITH TURNOFF PROTECTION

(75) Inventors: Franz Josef Niedernostheide, Muenster (DE); Martin Ruff, Vestenbergsgreuth (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 10/089,303

(22) PCT Filed: Sep. 29, 2000

(86) PCT No.: PCT/DE00/03440
§ 371 (c)(1),
(2), (4) Date: Oct. 15, 2007

(87) PCT Pub. No.: WO01/26227
PCT Pub. Date: Apr. 12, 2001

(30) Foreign Application Priority Data
Sep. 30, 1999 (DE) ................. 199 47 036

(51) Int. Cl.
*H01L 29/74* (2006.01)
(52) U.S. Cl. ................ 257/111; 257/E29.211
(58) Field of Classification Search ........... 257/107, 257/113, 114, 115, 116, 117, 118, 108, 109, 257/110, 111, 112, E29.171, E29.211
See application file for complete search history.

(56) References Cited

U.S. PATENT DOCUMENTS

| | | | |
|---|---|---|---|
| 3,590,346 A | 6/1971 | Bilo et al. | |
| 4,195,306 A | 3/1980 | Fullmann et al. | |
| 4,757,367 A * | 7/1988 | Konishi et al. | ............... 257/114 |
| 5,317,183 A * | 5/1994 | Hoffman et al. | ............ 257/369 |

FOREIGN PATENT DOCUMENTS

| | | |
|---|---|---|
| DE | 59-141269 | 8/1984 |
| DE | 196 50 762 A1 | 7/1998 |
| EP | 301 761 B1 | 2/1989 |
| JP | 56-46338 * | 4/1981 |

OTHER PUBLICATIONS

Japanese Patent Abstract, 56046338, Apr. 27, 1981.
Japanese Patent Abstract, 60097722, May 31, 1985.
Japanese Patent Abstract, 56025371, Mar. 11, 1981.
H.J. Schulze et al.: "Light Triggered 8kV Thyristor with a New Type of Integrated Breakover Diode", Siemens AG Corporate Research and Development, pp. 465-472.

* cited by examiner

*Primary Examiner*—Evan Pert
*Assistant Examiner*—Kevin Quinto
(74) *Attorney, Agent, or Firm*—Harness, Dickey & Pierce, PLC

(57) ABSTRACT

A thyristor arrangement includes a main thyristor, at least one auxiliary thyristor, a resistance device which electrically connects the auxiliary thyristor and the main thyristor to one another, and an optical triggering device for breakover triggering of the main thyristor via the auxiliary thyristor and the resistance device. The resistance device defines a time-dependent ohmic resistance in such a way that the value thereof is relatively large during a switch-on phase of the main thyristor and relatively small during a current-carrying phase of the main thyristor.

3 Claims, 5 Drawing Sheets

THYRISTOR ARRANGEMENT WITH TURNOFF PROTECTION

This application is the national phase under 35 U.S.C. § 371 of PCT International Application No. PCT/DE00/03440 which has an International filing date of Sep. 29, 2000, which designated the United States of America, the entire contents of which are hereby incorporated by reference.

FIELD OF THE INVENTION

The invention generally relates to a thyristor arrangement. More preferably, it can relate to a thyristor arrangement including a main thyristor, which has a cathode and an anode, at least one auxiliary thyristor, which has a cathode and an anode, a resistance device, which electrically connects the cathode of the auxiliary thyristor and the cathode of the main thyristor to one another and defines an ohmic resistance that is different from zero, an anode connection, which electrically connects the anode of the auxiliary thyristor and the anode of the main thyristor to one another, and a triggering device for breakover triggering of the main thyristor via the auxiliary thyristor and the resistance device.

BACKGROUND OF THE INVENTION

A thyristor arrangement is disclosed in EP 0 301 761 B1. In this known arrangement, the main thyristor with its cathode and anode, the auxiliary thyristor with its cathode and anode, the resistance device, the anode connection in the form of a short circuit and the triggering device are integrated on a common body made of semiconductor material.

The resistance device comprises an ohmic resistance. This resistance serves for electrical current limiting between the auxiliary thyristor and the main thyristor.

The triggering device is an electrical triggering device, and an ohmic resistance is likewise arranged between the triggering device and the auxiliary thyristor, the resistance likewise serving for current limiting.

JP-A-59 141 269 likewise discloses a thyristor arrangement, in which the main thyristor with its cathode and anode, the auxiliary thyristor with its cathode and anode, the resistance device, the anode connection and the triggering device are integrated on a common body made of semiconductor material.

The resistance device of this known arrangement comprises an individual resistance and the triggering device is an electrical triggering device.

On account of the fact that, in this known arrangement, the operating duration of the auxiliary thyristor part is longer than that of the main thyristor part, a forward voltage of the auxiliary thyristor compensates a voltage drop across the resistance and there also flows in the auxiliary thyristor a current with a current density which is exactly equal to or greater than that in the main thyristor. In particular, this fact on the one hand provides for a breakover by use of the auxiliary thyristor and on the other hand prevents a breakdown on account of current concentration during breakover.

H.-J. Schulze, M. Ruff, B. Baur, F. Pfirsch, H. Kazba, U. Kellner, P. Voss: "Light Triggered 8 kV Thyristor with a New Type of Integrated Breakover Diode", Proceedings of PCIM, Maui, 1996, pp. 465-472, disclose an optical triggering device for triggering a main thyristor, integrated on a body made of semiconductor material, by use of optical radiation, this triggering device and an auxiliary thyristor being integrated on said body made of semiconductor material.

SUMMARY OF THE INVENTION

An embodiment of the invention is based on an object of providing a thyristor arrangement which has a good recovery time protection. In this case, recovery time protection generally refers to protection against a situation where, as a result of an unavoidable voltage rise during the recovery time of a thyristor, the thyristor can trigger in an uncontrolled manner and thereby be destroyed (in this respect see DE 196 50 762 A1, for example).

An object can be achieved by use of a thyristor arrangement.

The resistance device preferably defines a time-dependent ohmic resistance in such a way that this resistance has a relatively large value during a switch-on phase of the main thyristor, and a relatively small value during a current-carrying phase of the main thyristor.

This solution can be based on at least one of the following insights: the auxiliary thyristor is intended to remain in the on state also during the current-carrying phase of the main thyristor. In order to protect the auxiliary thyristor against excessively high switch-on loading, a protective resistor is necessary. This protective resistor is necessary particularly if an integrated optical triggering device utilizes said auxiliary thyristor for controlled breakover triggering of the main thyristor. However, an excessively large protective resistor, for example a resistor with a value of greater than $50\Omega$, prevents the auxiliary thyristor from remaining in the on state also during the current-carrying phase of the main thyristor and can thus prevent the integration of a recovery time protection, for example.

It can be shown that the maximum permissible value of the protective resistor that can be used for a recovery time protection must typically be less than $50\Omega$.

On the other hand, the auxiliary thyristor must be prevented from being destroyed by an excessively high current during the switching-on of the main thyristor. This can be achieved by use of a protective resistor having a value of greater than $50\Omega$, in which case there is again the risk of integration of a recovery time protection being prevented.

If the resistor is replaced by a resistance device having a time-dependent resistance value which is designed and/or controlled in such a way that the current of the auxiliary thyristor is effectively limited at the beginning of the switching-on of the thyristor arrangement and, at the same time, the resistance value of the resistance device is only small during the current-carrying phase of the main thyristor, then the auxiliary thyristor can both be protected at the switch-on instant and remain in the on state also during the current-carrying phase of the main thyristor and the integration of a recovery time protection can thus succeed.

The resistance device may be, for example, an ohmic resistance whose resistance value is variable in a controlled manner and which is controlled in such a way that the resistance value is relatively large during the switch-on phase of the main thyristor and relatively small during the current-carrying phase of the main thyristor.

Preferably and advantageously, the resistance device is designed in such a way that the resistance automatically decreases from the relatively large value to the relatively small value.

A preferred and advantageous refinement of such a resistance device has an ohmic resistance of an essentially fixed value and an inductance and/or capacitance. The combination of the ohmic resistance, the inductance and/or the capacitance is to be chosen only such that the resistance value of the resistance device is high at the beginning of the switch-on operation but then decreases to a defined smaller value. In an advantageous refinement of the thyristor arrangement according to an embodiment of the invention, the main thyristor with its cathode and anode, the auxiliary thyristor with its cathode and anode, the resistance device, the anode connection and the triggering device are integrated on a common body made of semiconductor material.

In this refinement, preferably and advantageously, the resistance device has an integrated inductance in the form of a spiral which is made of electrically conductive material and is formed on the body made of semiconductor material.

In another advantageous refinement of the thyristor arrangement according to an embodiment of the invention, the main thyristor with its cathode and anode is integrated on one body made of semiconductor material, and the auxiliary thyristor with its cathode and anode is integrated on another body made of semiconductor material. In this refinement, in which the auxiliary thyristor is external from the main thyristor, there is the advantage of the significantly greater freedom in the configuration of the resistance device, in particular the resistance device having a combination of ohmic resistance, inductance and/or capacitance. In this case, there is primarily a significantly greater freedom in the configuration of the inductance.

In the thyristor arrangement according to an embodiment of the invention, the triggering device is preferably and advantageously an optical triggering device which is integrated on a body made of semiconductor material of the auxiliary thyristor. If, in this case, the main thyristor and the auxiliary thyristor are integrated on a common body made of semiconductor material, an optically triggerable main thyristor results. By contrast, if the auxiliary thyristor is realized in external fashion and connected to the main thyristor via an external resistance device, to an extent an electrically triggerable main thyristor results.

BRIEF DESCRIPTION OF THE DRAWINGS

The invention is explained in more detail by way of example in the description below with reference to the drawings, in which.

Figure 1:
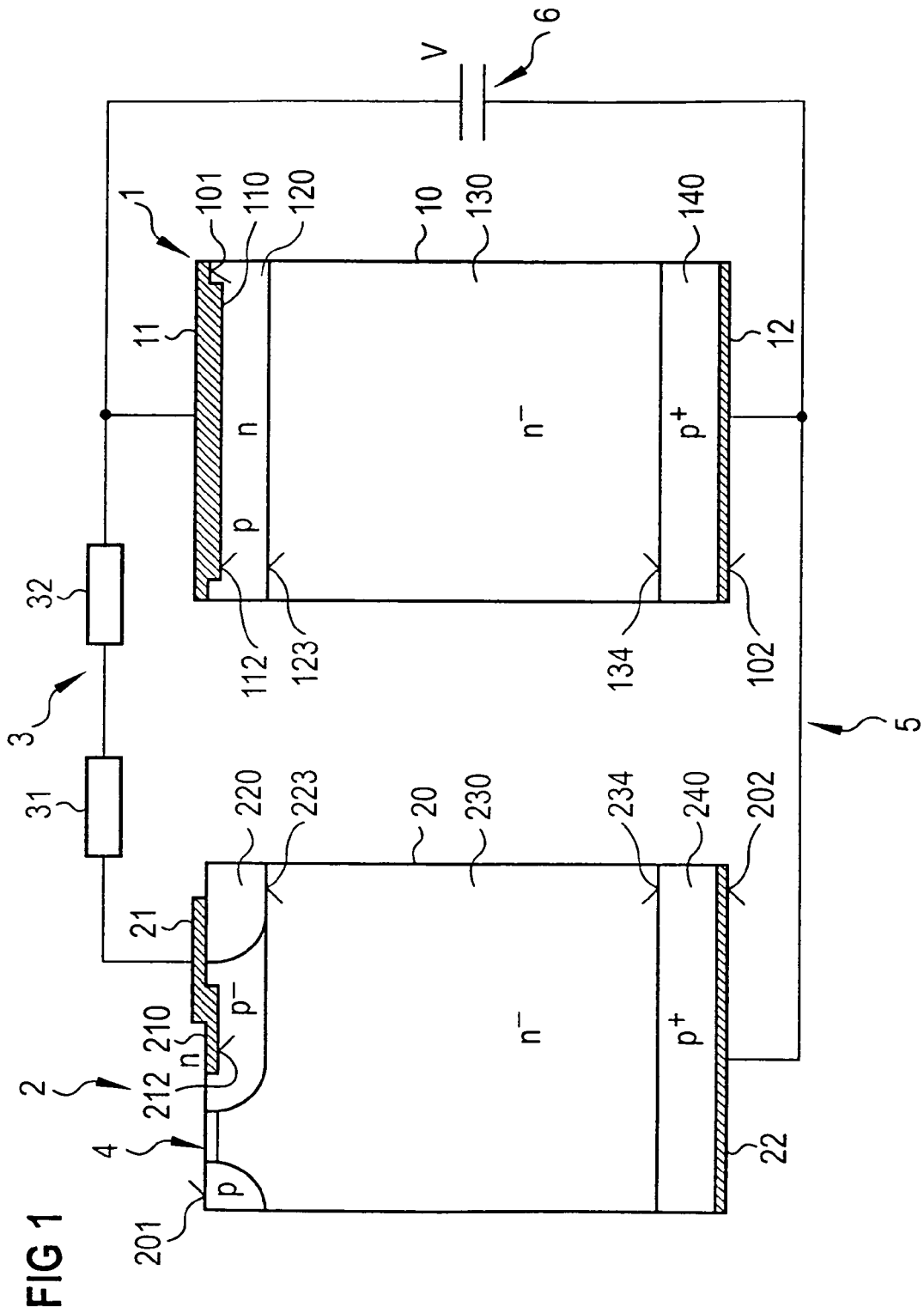
FIG. 1 shows a first exemplary embodiment of the thyristor arrangement according to the invention.

The figures are diagrammatic and not to scale.

DETAILED DESCRIPTION OF THE PREFERRED EMBODIMENTS

In the exemplary embodiments of the thyristor arrangement according to the invention which are illustrated in FIGS. 1 to 4, the main thyristor is designated generally by 1, the auxiliary thyristor is designated generally by 2, the resistance device is designated generally by 3 and the triggering device is designated generally by 4.

The main thyristor 1 has a body 10 made of differently doped semiconductor material, for example silicon, an electrode 11 serving as cathode, and an electrode 12 serving as anode.

The cathode 11 and the anode 12 are formed on surface regions 101 and 102, respectively, of the body 10 which are remote from one another.

Between the cathode 11 and the anode 12, the body 10 has a region 110 which is made of n-doped semiconductor material and serves as cathodal emitter of the main thyristor 1 and adjoins the surface region 101 of the body 10 in the region of the cathode 11.

A region 120 which is made of p-doped semiconductor material of the body 10 and serves as cathodal base of the main thyristor 1 adjoins the cathodal emitter 110 and forms an np junction 112 together with the cathodal emitter 110.

A region 130 which is made of n$^-$-doped semiconductor material of the body 10 and serves as anodal base of the main thyristor 1 adjoins the cathodal base 120 and forms a pn junction 123 together with the cathodal base 120.

A region 140 which is made of p$^+$-doped semiconductor material of the body 10 and serves as anodal emitter of the main thyristor 1 adjoins the anodal base 130. The region 140 on the one hand forms an np junction 134 together with the anodal base 120 and, on the other hand, adjoins the surface section 102 of the body 10 in the region of the anode 12.

Figure 2:
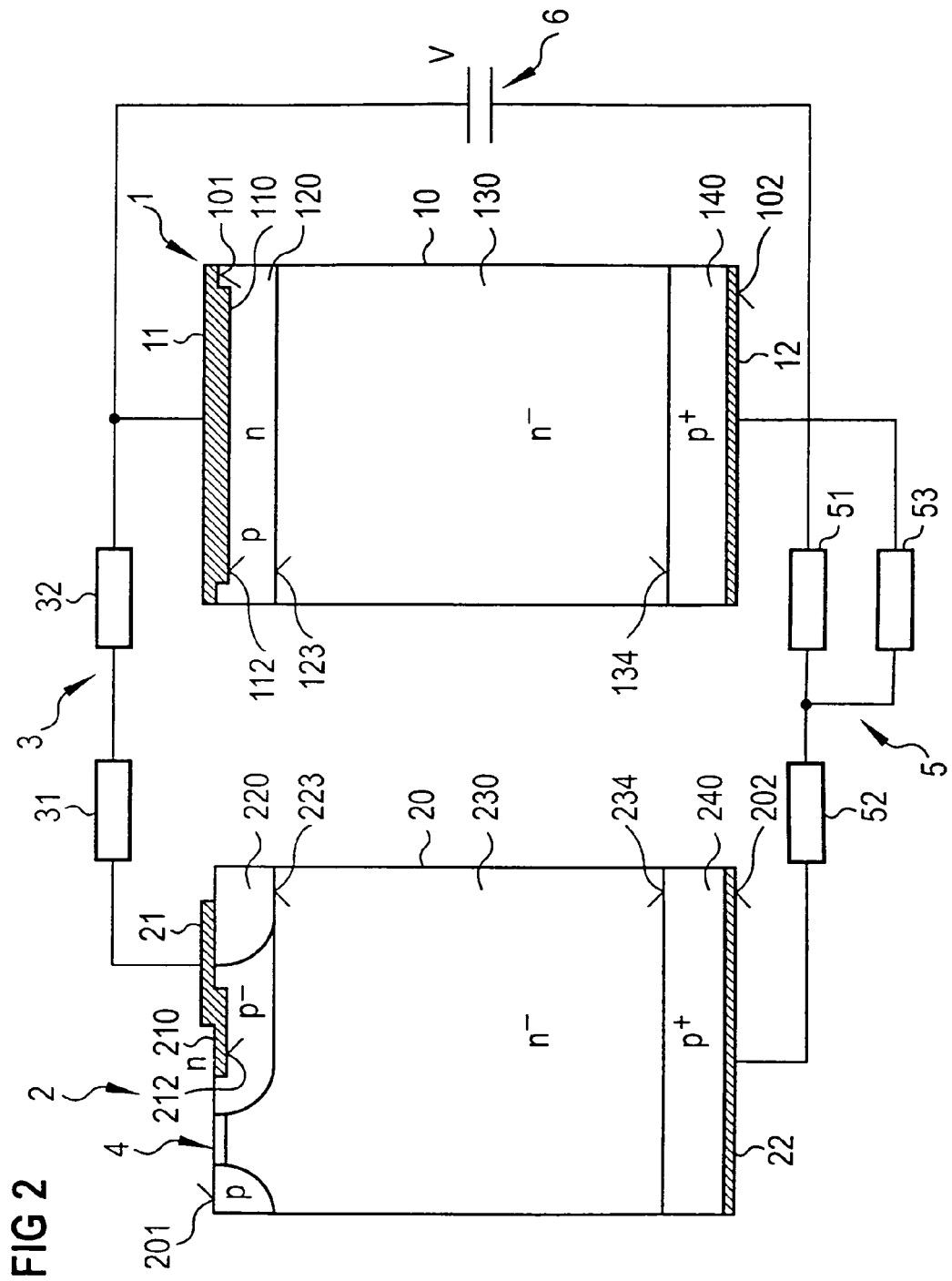
FIG. 2 shows a variant of the first exemplary embodiment.
Figure 3:
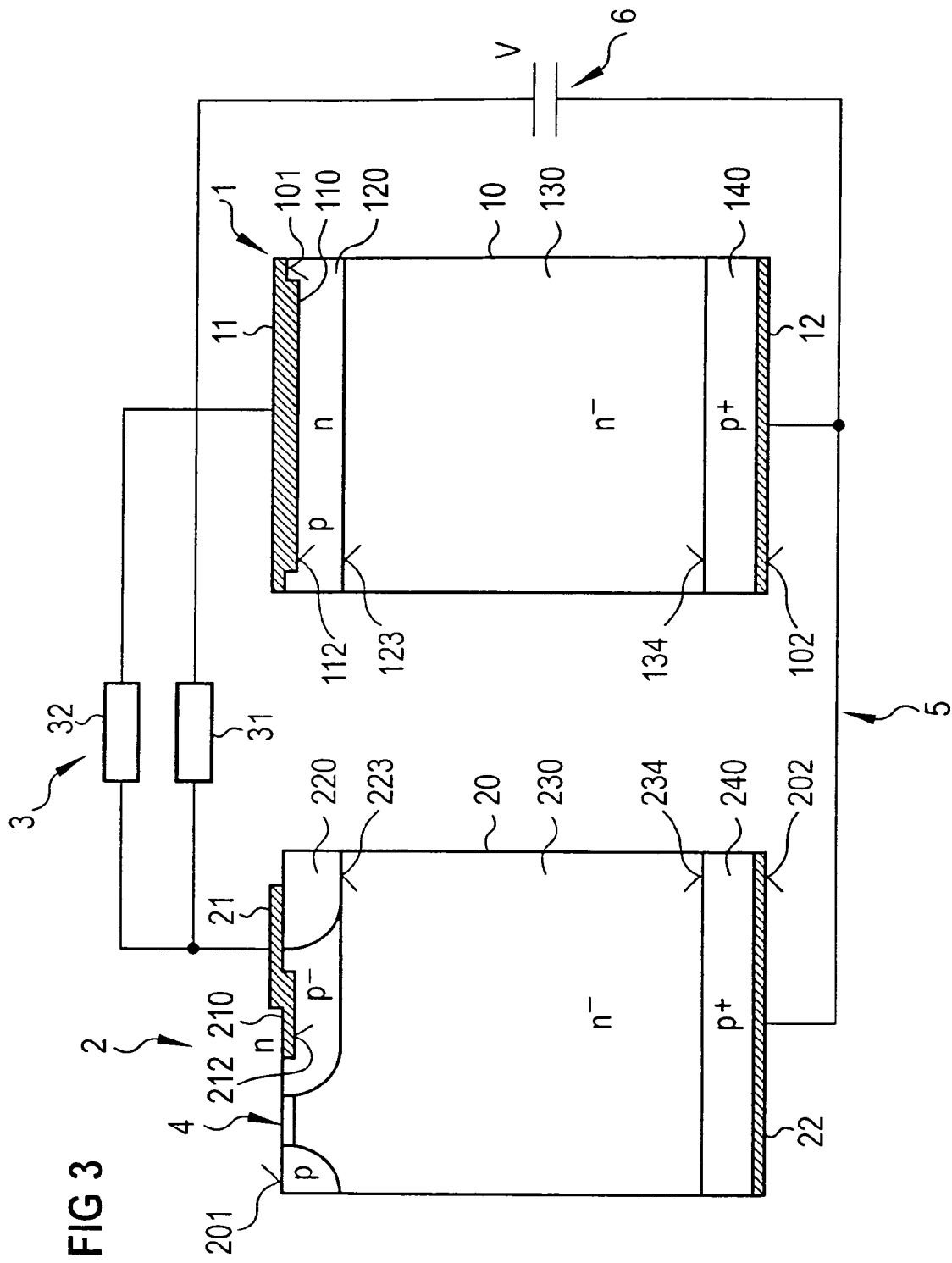
FIG. 3 shows a second exemplary embodiment of the thyristor arrangement according to the invention.

In the exemplary embodiments according to FIGS. 1 to 3, the auxiliary thyristor 2 has, for example, another body 20, which is separate from the body 10 of the main thyristor 1 and is made of differently doped semiconductor material, for example likewise silicon, an electrode 21 serving as cathode, and an electrode 22 serving as anode.

The cathode 21 and the anode 22 of the auxiliary thyristor 2 are formed on surface regions 201 and 202, respectively, of the body 20 which are remote from one another.

Between the cathode 21 and the anode 22, the body 20 has a region 210 which is made of n-doped semiconductor material and serves as cathodal emitter of the auxiliary thyristor 2 and adjoins the surface region 201 of the body 20 in the region of the cathode 21. A region 220 which is made of p-doped semiconductor material of the body 20 and serves as cathodal base of the auxiliary thyristor 2 adjoins the cathodal emitter 210 of the auxiliary thyristor 2 and forms an np junction 212 together with the cathodal emitter 210.

A region 230 which is made of n$^-$-doped semiconductor material of the body 20 and serves as anodal base of the auxiliary thyristor 2 adjoins the cathodal base 220 and forms a pn junction 223 together with the cathodal base 220.

A region 240 which is made of p$^+$-doped semiconductor material of the body 20 and serves as anodal emitter of the auxiliary thyristor 2 adjoins the anodal base 230. The region 240 on the one hand forms an np junction 234 together with the anodal base 220 and, on the other hand, adjoins the surface section 202 of the body 20 of the auxiliary thyristor 2 in the region of the anode 22.

Figure 4:
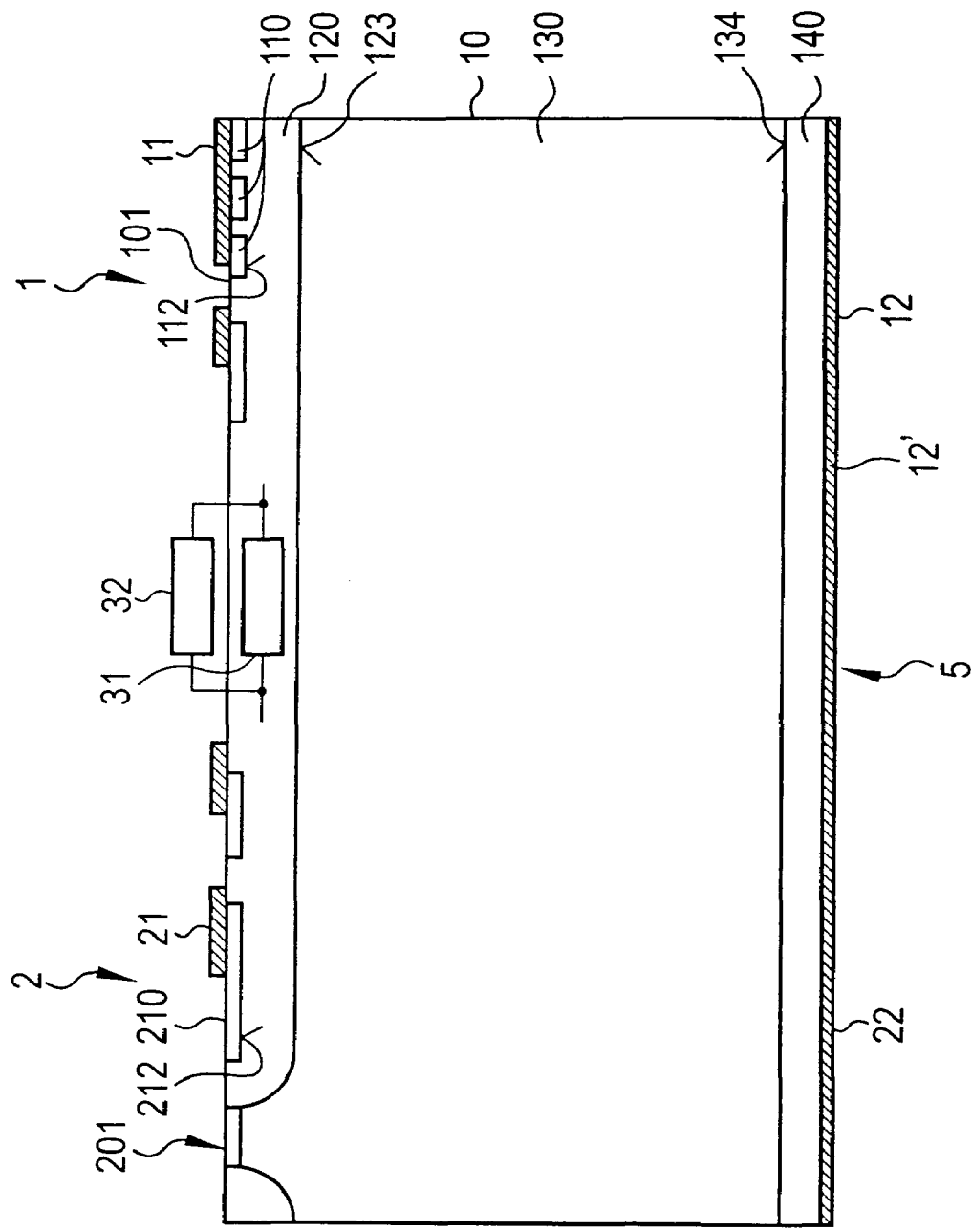
FIG. 4 shows a variant of the second exemplary embodiment.

The exemplary embodiments according to FIGS. 1, 2 and 4 have an electrical anode connection 5, which electrically connects the anode 22 of the auxiliary thyristor 2 and the anode 12 of the main thyristor 1 to one another and is designed in the form of a short circuit.

The exemplary embodiments according to FIG. 4 differs from the exemplary embodiments according to FIGS. 1 to 3 inter alia by the fact that the main thyristor 1 with its cathode 11 and anode 12, the auxiliary thyristor 2 with its cathode 21 and anode 22 are integrated on a common body made of semiconductor material, for example the body 10 of the main thyristor 1.

Like the cathode 11 of the main thyristor 1, but separated from said cathode by an interspace 111, the cathode 21 of the auxiliary thyristor 2 is formed on the surface region 101 of the body 10, and, like the anode 12 of the main thyristor 1, the anode 22 of the auxiliary thyristor 2 is formed on the surface region 102 of the body 10. The cathodal emitter of the auxiliary thyristor 2 is formed by a region 210 made of n-doped semiconductor material of the body 10.

This region 210 is arranged in the region 120 which is made of p-doped semiconductor material of the body 10 and serves as cathodal base, and forms an np junction 212 together with the region 120 and adjoins the surface region 101 of the body 10 in the region of the cathode 21 of the auxiliary thyristor 2.

Otherwise, in the exemplary embodiment, the body 10 made of differently doped semiconductor material is identical both in the region of the auxiliary thyristor 2 and in the region of the main thyristor 1 and is formed in the same way as in the exemplary embodiments according to FIGS. 1 to 3.

In the exemplary embodiment according to FIG. 4, the anode 22 of the auxiliary thyristor 2, the anode 12 of the main thyristor 1 and the anode connection 5 in the form of the short circuit are realized by a single electrode 12' formed on the surface section 102 of the body 10.

In all the exemplary embodiments, a resistance device 3 is present, which electrically connects the cathode 21 of the auxiliary thyristor 2 and the cathode 11 of the main thyristor to one another and defines an ohmic resistance which is different from zero.

According to the invention, this resistance device 3 is designed in such a way that it defines a time-dependent ohmic resistance in such a way that this resistance has a relatively large value during a switch-on phase of the main thyristor 1 and a relatively small value during a current-carrying phase of the main thyristor 1.

Moreover, in all of the exemplary embodiments, a resistance device 3 is formed in such a way that the resistance automatically decreases from the relatively large value to the relatively small value, this being achieved with the aid of a combination of an ohmic resistance of an essentially fixed value and an inductance and/or capacitance.

In the exemplary embodiment according to FIG. 1, the resistance device 3 has a series circuit comprising the ohmic resistance of the essentially fixed value designated by 31 and the inductance and/or capacitance designated by 32.

The exemplary embodiment according to FIG. 2 is a variant of the example according to FIG. 1 and differs from the example according to FIG. 1 solely by virtue of the particular design of the anode connection 5, which has a series circuit comprising an inductance and/or capacitance designated by 52 and a parallel circuit comprising an ohmic resistance designated by 51 and a further inductance and/or capacitance designated by 53.

In the exemplary embodiment according to FIG. 3, the resistance device 3 has a parallel circuit comprising the ohmic resistance of the essentially fixed value designated by 31 and the inductance and/or capacitance designated by 32.

In the exemplary embodiment according to FIG. 4, too, the resistance device 3 has a parallel circuit comprising the ohmic resistance of the essentially fixed value designated by 31 and the inductance and/or capacitance designated by 32. In this example, the resistance device 3 is integrated on the common body 10 made of semiconductor material, for example in the interspace 111 at the surface region 101 of the body 10.

Instead of the illustrated exemplary combinations of ohmic resistance 31 and inductance and/or capacitance 32, it is also possible to use other combinations. The same applies to the anode connection 5 of the example according to FIG. 2.

In FIGS. 1 to 3, 6 designates a device for generating an electric voltage V between the cathode 11 and the anode 12 of the main thyristor 1.

In specific designs of the exemplary embodiments according to FIGS. 1 to 4, the resistance device 3 has a combination of the ohmic resistance 31 and only an inductance 32 without a capacitance.

In the case of these designs, in particular, it is of crucial importance that the inductance 32, 52 or 53 is dimensioned to be large enough such that the current rise at the beginning of the switch-on phase of the main thyristor 1 is effectively braked. While the resistance value of the resistance 31 or 51 lies in the range from 10Ω to 200Ω, the value of the inductance 32, 52 or 53 must lie in the range from 10 μH to a few mH. In the case of a serial inductance 32 without a parallel resistance, it was possible to show that, given a value of 100 μH or 1 mH for the serial inductance 32, the temperature increase in the auxiliary thyristor 2 is significantly smaller than without an inductance (inductance value=0). It can be concluded from this that an inductance of the order of magnitude of 1 mH effectively protects the auxiliary thyristor 2. Both in the resistance 32 and in the inductance 32, power is consumed only very briefly, so that heating resulting from this can easily be controlled.

Figure 5:
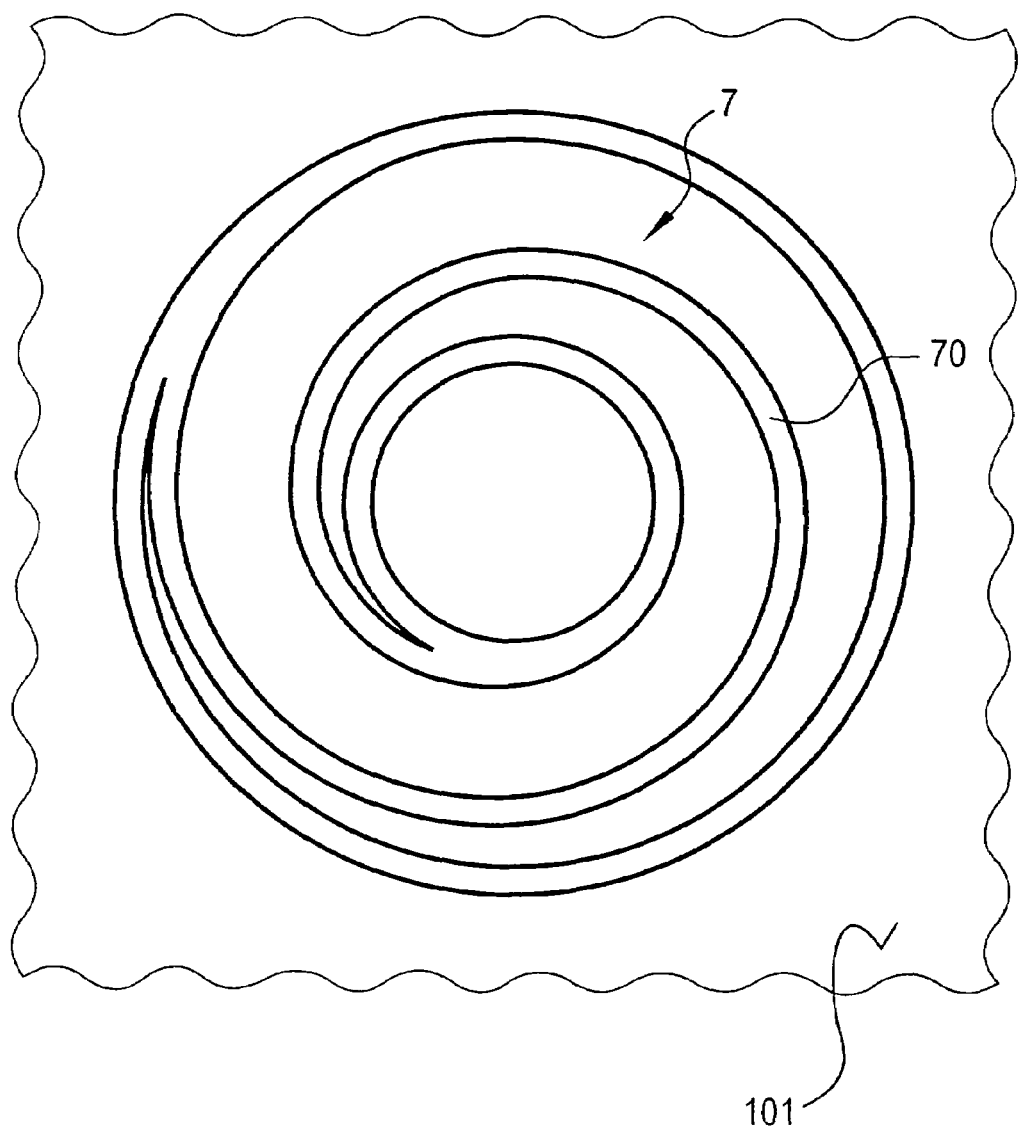
FIG. 5 shows a plan view of an inductance in the form of a spiral made of electrically conductive material.

In order to integrate an inductance directly on a body made of semiconductor material, it can be applied in the form of a spiral which is made of electrically conductive material and is formed on the body made of semiconductor material. In FIG. 5, such a spiral is illustrated by way of example in plan view and designated by 7. It comprises a spirally wound strip 70 which is made of electrically conductive material and is formed for example on the surface region 101 of the body 10 made of semiconductor material. By way of example, such a spiral 7 can be placed over an integrated resistor.

The triggering device 4 for breakover triggering of the main thyristor 1 via the auxiliary thyristor 2 and the resistance device 3 is preferably an optical triggering device which is integrated on the body 20 or 10 made of semiconductor material of the auxiliary thyristor 2. The optical triggering device disclosed in the abovementioned document Proceedings of PCIM is suitable for this.

In the exemplary embodiment according to FIG. 4, the resistance device 3, the anode connection 5 and the optical triggering device 4 can be jointly integrated on the body 10 made of semiconductor material.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A thyristor arrangement, comprising:
a main thyristor, including a cathode and an anode;
at least one auxiliary thyristor, including a cathode and an anode;
a resistance device, electrically connecting the cathode of the auxiliary thyristor and the cathode of the main thyristor and defining an ohmic resistance that is different from zero;
an anode connection, electrically connecting the anode of the auxiliary thyristor and the anode of the main thyristor; and
a triggering device for breakover triggering of the main thyristor via the auxiliary thyristor and the resistance device, wherein the resistance device defines a time-dependent ohmic resistance in such a way that this resistance has a relatively large value during a switch-on phase of the main thyristor and a relatively small value during a current-carrying phase of the main thyristor, wherein the resistance automatically decreases from the relatively large value to the relatively small value, the resistance device has an ohmic resistance of an essentially fixed value and at least one of an inductance and capacitance, the resistance device is a series circuit comprising the ohmic resistance of the essentially fixed value and the inductance or capacitance and the anode connection has a series circuit comprising at least one of an inductance and capacitance and a parallel circuit comprising an ohmic resistance and at least one of a further inductance and capacitance.

2. A thyristor arrangement, comprising:
a main thyristor, including a cathode and an anode;
at least one auxillary thyristor, including a cathode and an anode;
a resistance device, electrically connecting the cathode of the auxiliary thyristor and the cathode of the main thyristor and defining an ohmic resistance that is different from zero;
an anode connection, electrically connecting the anode of the auxiliary thyristor and the anode of the main thyristor; and
a triggering device for breakover triggering of the main thyristor via the auxiliary thyristor and the resistance device, wherein the resistance device defines a time-dependent ohmic resistance in such a way that this resistance has a relatively large value during a switch-on phase of the main thyristor and a relatively small value during a current-carrying phase of the main thyristor, wherein the main thyristor with its cathode and anode, the auxiliary thyristor with its cathode and anode, the resistance device, the anode connection and the triggering device are integrated on a common body made of semiconductor material and the resistance device includes an integrated inductance in the form of a spiral which is made of electrically conductive material and is formed on the body made of semiconductor material.

3. The thyristor arrangement as claimed in claim 2, wherein the triggering device is an optical triggering device which is integrated on a body made of semiconductor material of the auxiliary thyristor.

* * * * *